(12) United States Patent
Kawai

(10) Patent No.: US 6,686,294 B2
(45) Date of Patent: Feb. 3, 2004

(54) METHOD AND APPARATUS FOR ETCHING SILICON NITRIDE FILM AND MANUFACTURING METHOD OF SEMICONDUCTOR DEVICE

(75) Inventor: Kenji Kawai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/816,403

(22) Filed: Mar. 26, 2001

(65) Prior Publication Data
US 2002/0046986 A1 Apr. 25, 2002

(30) Foreign Application Priority Data
Oct. 20, 2000 (JP) ......................................... 2000-320533

(51) Int. Cl.[7] ............................................. H01L 21/302
(52) U.S. Cl. ........................ 438/714; 438/723; 438/724
(58) Field of Search ................................. 438/700, 706, 438/710, 712, 714, 723, 724

(56) References Cited

U.S. PATENT DOCUMENTS

| 4,529,476 A | * | 7/1985 | Kawamoto et al. .... 204/192.37 |
| 5,695,602 A | * | 12/1997 | Takeshiro .................... 216/67 |
| 5,716,534 A | * | 2/1998 | Tsuchiya et al. ............... 216/67 |
| 5,741,396 A | * | 4/1998 | Loewenstein ............... 438/724 |
| 6,033,481 A | * | 3/2000 | Yokogawa et al. ...... 118/723 E |
| 6,068,784 A | * | 5/2000 | Collins et al. ............ 118/723 I |
| 6,129,808 A | * | 10/2000 | Wicker et al. ........... 156/345.1 |
| 6,143,144 A | * | 11/2000 | Golovato et al. ...... 204/192.33 |
| 6,207,544 B1 | * | 3/2001 | Nguyen et al. ............. 438/595 |
| 6,287,974 B1 | * | 9/2001 | Miller ........................ 438/706 |

FOREIGN PATENT DOCUMENTS

| JP | 6-132253 | 5/1994 |
| JP | 6-181190 | 6/1994 |
| JP | 10-50660 | 2/1998 |
| JP | 11-145113 | 5/1999 |
| JP | 11-251291 | 9/1999 |

* cited by examiner

Primary Examiner—Kin-Chan Chen
(74) Attorney, Agent, or Firm—McDermott, Will & Emery

(57) ABSTRACT

An etching method used to selectively etch a silicon nitride film is achieved that enables the selective ratio of the silicon nitride film relative to a silicon oxide film to be sufficiently high. The etching method uses a reactive ion etching apparatus including a process chamber holding herein a substrate to be etched, gas supply means for supplying a reactant gas into the process chamber, and an upper electrode and a lower electrode provided within the process chamber and applied with high-frequency currents. The etching is performed under the conditions that the reactant gas includes halogen-based gas, the pressure of the reactant gas in the chamber is 12.0 Pa-66.7 Pa, the flow rate of the reactant gas supplied into the chamber is 0.1 liter/min–0.55 liter/min, and the distance between the upper and lower electrodes is 50 mm–120 mm.

3 Claims, 6 Drawing Sheets

METHOD AND APPARATUS FOR ETCHING SILICON NITRIDE FILM AND MANUFACTURING METHOD OF SEMICONDUCTOR DEVICE

BACKGROUND OF THE INVENTION

1. Field of the Invention

The present invention relates to etching methods and etching apparatuses as well as manufacturing methods of semiconductor devices. More particularly, the invention relates to a method of etching a silicon nitride film and an etching apparatus for performing the etching method, as well as a method of manufacturing a semiconductor device employing that etching method.

2. Description of the Background Art

Semiconductor devices such as a DRAM (Dynamic Random Access Memory) have been known. These semiconductor devices are becoming finer and integration thereof is progressing to a greater degree. Accordingly, there arises a need for finer processing dimensions in a manufacturing process of the semiconductor devices. Further, a mask alignment margin is being reduced that is provided in consideration of mask alignment errors in a photolithography process step of the manufacturing process of the semiconductor devices.

An approach employed for addressing such finer processing dimensions is to form a self-aligned contact as described below, in a step of forming a contact hole between gate electrodes of a plurality of field effect transistors.

Specifically, according to the approach to form the self-aligned contact, sidewalls of the gate electrodes are covered with an insulating film to form a sidewall film. As a material for the insulating film constituting the sidewall film, a silicon nitride film or the like is used having a higher selective etching ratio with respect to a silicon oxide film which is a material for an interlayer insulating film. After the sidewall film is formed, the interlayer insulating film formed of the silicon oxide film is deposited on the gate electrodes. In this interlayer insulating film, a contact hole is formed between the gate electrodes. In an etching step for producing the contact hole, assume that the position of the contact hole is shifted from a predetermined position to a certain extent. As the sidewall film made of the silicon nitride film is formed on the sidewalls of the gate electrodes, this etching step never causes the contact hole to reach the gate electrodes. Even if the contact hole is filled with a conductive film, it is possible to prevent the conductive film and the gate electrodes from being short-circuited.

As shown in FIGS. 14–17, in order to produce such a self-aligned contact, it is necessary to form the silicon nitride film to cover the gate electrodes and thereafter partially remove the silicon nitride film by anisotropic etching thereby form a sidewall film formed of the silicon nitride film. FIGS. 14–17 are cross sections showing a conventional method of manufacturing a semiconductor device, illustrating an etching step for forming the sidewall film. The conventional method of manufacturing a semiconductor device is now described in conjunction with FIGS. 14–17.

Referring to FIG. 14, a silicon oxide film 111 constituting a gate insulating film is deposited on a substrate 110 such as a silicon substrate. Silicon oxide film 111 here is 3 nm in thickness. On silicon oxide film 111, a two-layer film 112 made of a tungsten silicide film and a polysilicon film is formed to produce gate electrodes. The tungsten silicide film and the polysilicon film each have a thickness of 50 nm. A silicon nitride film 113 is formed on two-layer film 112. Silicon nitride film 113 is 150 nm in thickness. A resist film (not shown) is formed on silicon nitride film 113. This resist film is photolithographically processed to form a resist film 114 having a gate pattern.

Resist film 114 is used as a mask to partially remove, through etching, silicon nitride film 113 thereby produce upper silicon nitride films 120a and 120b. Resist film 114 is thereafter removed. Upper silicon nitride films 120a and 120b are used as masks to partially remove, through etching, two-layer film 112 thereby produce gate electrodes 115a and 115b. The structure as shown in FIG. 15 is thus achieved.

Referring to FIG. 16, a silicon nitride film 116 is formed to cover gate electrodes 115a and 115b. Silicon nitride film 116 is 40 nm in thickness.

Silicon nitride film 116 is partially removed through anisotropic etching to form sidewall films 117a–117d formed of the silicon nitride film on the sidewalls of gate electrodes 115a and 115b as shown in FIG. 17.

In the etching process for forming sidewall films 117a–117d, if silicon nitride film 116 does not have its selective ratio higher enough relative to silicon oxide film 111, silicon oxide film 111 is partially eliminated by this etching as shown in FIG. 17. Consequently, there are generated a portion of the substrate cut away through this etching (substrate cutaway portion) 144 and a damaged portion 145 having defects in substrate 110. This damage of substrate 110 causes a deteriorated reliability of a semiconductor device including components such as field effect transistors formed on substrate 110.

Various techniques have accordingly been proposed for preventing such substrate cutaway portion 144 and damaged portion 145 of substrate 110.

According to a method disclosed in Japanese Patent Laying-Open No. 11 -145113 for example, a silicon nitride film is etched to form a sidewall film by using a parallel plane RIE (Reactive Ion Etching) apparatus and chlorine gas as a reactant gas. The frequency of a high-frequency power supply and the power supplied to upper and lower electrodes are optimized to increase the selective ratio of the silicon nitride film with respect to a silicon oxide film (i.e. etching rate of silicon nitride film/etching rate of silicon oxide film).

Nevertheless, the selective ratio of the silicon nitride film relative to the silicon oxide film disclosed in Japanese Patent Laying-Open No. 11-145113 is approximately 10, and this value of the selective ratio is insufficient. Therefore, damages to silicon oxide film 111 and substrate 110 as shown in FIG. 17 cannot surely be avoided.

According to a technique proposed in Japanese Patent Laying-Open No. 10-50660, a silicon nitride film is etched to form a sidewall film by using as a reactant gas a mixed gas of chlorine gas and hydrogen bromide gas and consequently the selective ratio of the silicon nitride film relative to a silicon oxide film is approximately 20.

An inventor reviewed this technique and found that an increased ratio of the hydrogen bromide in the reactant gas as described above would result in a problem as shown in FIG. 18 that deposition on sidewall films 117a–117d occurs in the etching process, and the deposition parts have functions as a mask in etching to cause partially abnormal shapes of sidewall films 117a–117d. FIG. 18 is a cross section illustrating the abnormal shapes of sidewall films 117a–117d. Such abnormality in the shape of sidewall films 117a–117d (shape defect) is one factor of any step on the upper surface of an interlayer insulating layer for example formed on gate electrodes 115a and 115b. Such a step may cause failures like disconnection in an interconnection layer formed on the interlayer insulating layer. As a result, the reliability of devices formed on substrate 110 deteriorates.

SUMMARY OF THE INVENTION

One object of the present invention is to provide an etching method that enables the selective ratio of a silicon nitride film to be sufficiently higher relative to a silicon oxide film without causing shape defects of the etched silicon nitride film, and an etching apparatus for applying this etching method.

Another object of the invention is to provide a method of manufacturing a semiconductor device having a high reliability, the semiconductor device being formed by using an etching method enabling the selective ratio of a silicon nitride film to be sufficiently higher relative to a silicon oxide film without causing shape defects of the etched silicon nitride film.

According one aspect of the invention, an etching method for selectively etching a silicon nitride film formed on a substrate on which a silicon oxide film and the silicon nitride film are formed uses a reactive ion etching apparatus including a process chamber holding therein the substrate to be etched, gas supply means for supplying a reactant gas into the process chamber, and an upper electrode and a lower electrode provided in the process chamber and applied with respective high-frequency currents. The substrate is placed on the lower electrode. The etching is performed under the conditions that the reactant gas includes halogen-based gas, the reactant gas in the process chamber has a pressure of at least 12.0 Pa (90 mTorr) and at most 66.7 Pa (500 mTorr), the reactant gas is supplied into the process chamber at a flow rate of at least 0.1 liter/min (100 sccm) and at most 0.55 liter/min (550 sccm), and the distance between the upper electrode and the lower electrode is at least 50 mm and at most 120 mm.

The reactive ion etching apparatus having the upper and lower electrodes can thus be used to etch the silicon nitride film with a sufficiently high selective ratio of the silicon nitride film relative to the silicon oxide film. For the substrate with the silicon oxide film and the silicon nitride film formed thereon, it is possible to prevent the silicon oxide film from being partially removed when the silicon nitride film is selectively etched. In this way, occurrence of any defect such as damage to the substrate can be avoided that is due to removal of the silicon oxide film. It is further possible to avoid defect in the shape of the silicon nitride film from occurring in the etching process, according to the present invention.

The reasons for setting the pressure of the reactant gas at 12.0 Pa-66.7 Pa are as follows. When the pressure is lower than 12.0 Pa, a sufficiently high selective ratio of the silicon nitride film relative to the silicon oxide film is difficult to achieve. On the other hand, when the pressure exceeds 66.7 Pa, unstable discharging occurs that is caused by application of high-frequency currents to the upper and lower electrodes in the process chamber, resulting in unstable etching. Further, in the etching process, a deposition process dominates an etching process which extremely lowers the selective ratio. Otherwise, the selective ratio of the substrate surface being etched varies to a greater extent (i.e., the uniformity of the selective ratio deteriorates).

The reasons for setting the flow rate of the reactant gas at 0.1 liter/min (100 sccm)-0.55 liter/min (550 sccm) are as follows. When the flow rate is lower than 0.1 liter/min, the selective ratio of the substrate surface being etched varies to a greater extent (the uniformity of the selective ratio deteriorates). On the other hand, when the flow rate exceeds 0.55 liter/min, the reactant gas in the process chamber is difficult to be discharged by a pump. Here, 1 sccm (standard cubic centimeter per minute) means that the flow rate of gas at 0° C. and 1 standard atmosphere is 1 cm$^3$ per minute.

The distance between the upper and lower electrodes (electrode interval) is defined as 50 mm–120 mm for the reason that the electrode interval smaller than 50 mm or greater than 120 mm would deteriorate the uniformity of the selective ratio of the silicon nitride film with respect to the silicon oxide film.

Preferably, the etching method according to the one aspect of the invention is performed under the conditions that the high-frequency current supplied to the upper electrode has a frequency of at least 12 MHz and at most 60 MHz and the high-frequency current supplied to the lower electrode has a frequency of 13.56 MHz.

A high-frequency supply for generating high-frequency current in such a frequency range is easily available in general, and the manufacturing cost of the etching apparatus, to which the etching method of the invention is applied, can be prevented from rising.

Preferably, the etching method according to the one aspect of the invention may be performed under the conditions that the high-frequency current applied to the upper electrode has a frequency of 13.56 MHz and respective high-frequency currents supplied to the upper and lower electrodes are different in the phase (out of phase) from each other.

In this case, the high-frequency currents can be supplied to the upper and lower electrodes from a high-frequency supply at 13.56 MHz, which is especially in common use.

According to another aspect of the invention, an etching method for selectively etching a silicon nitride film formed on a substrate on which a silicon oxide film and the silicon nitride film are formed uses an inductively coupled plasma etching apparatus including a process chamber holding therein the substrate to be etched, a coil for generating plasma for etching in the process chamber, and gas supply means for supplying a reactant gas into the process chamber. The etching is performed under the conditions that the reactant gas includes halogen-based gas, the distance between the substrate and the coil is at least 80 mm and at most 1000 mm, the reactant gas in the process chamber has a pressure of at least 0.5 Pa (3.7 mTorr) and at most 66.7 Pa (500 mTorr), and the reactant gas is supplied into the process chamber at a flow rate of at least 0.05 liter/min (50 sccm) and at most 0.55 liter/min (550 sccm).

The inductively coupled plasma etching apparatus can thus be used to etch the silicon nitride film with a sufficiently high selective ratio of the silicon nitride film relative to the silicon oxide film. For the substrate with the silicon oxide film and the silicon nitride film formed thereon, it is possible to prevent the silicon oxide film from being partially removed when the silicon nitride film is selectively etched. In this way, occurrence of any defect such as damage to the substrate can be avoided that is due to removal of the silicon oxide film. It is further possible to avoid defect in the shape of the silicon nitride film from occurring in the etching process, according to the present invention.

The distance between the substrate and the coil that is smaller than 80 mm deteriorates the uniformity in the substrate surface of the etching selective ratio of the silicon nitride film relative to the silicon oxide film. The distance between the substrate and the coil that exceeds 1000 mm lowers the etching rate of the silicon nitride film, making it difficult to smoothly etch the silicon nitride film.

The pressure of the reactant gas is set at 0.5 Pa-66.7 Pa for the following reasons. If the pressure is lower than 0.5 Pa, a sufficiently high selective ratio of the silicon nitride film relative to the silicon oxide film is difficult to obtain. On the other hand, if the pressure is higher than 66.7 Pa, the plasma generated in the process chamber is unstable which deteriorates stability in etching. Further, in the etching process, a deposition process dominates an etching process and thus the selective ratio becomes extremely lower or the uniformity of the selective ratio of the substrate surface being etched declines. In the inductively coupled plasma etching apparatus, which is compared here with the reactive ion etching apparatus including the upper and lower electrodes, the reactant gas can have the pressure with its lower limit smaller than that in the reactive ion etching apparatus, the reasons for this are as follows. The inductively coupled plasma etching apparatus uses the amount of the high-frequency current supplied to the coil to control the amount of generated plasma or etchants (ions or radical for etching) while sets the lower electrode provided under the substrate at a predetermined potential (i.e. a bias current is supplied to the lower electrode) to attract the etchants toward the substrate. In other words, the amount of generated etchants and attraction of the etchants toward the substrate can separately be controlled. Therefore, even if the reactant gas has a low pressure, a satisfactory selective ratio is achieved by setting the lower electrode at a predetermined potential (i.e. the bias is applied).

The flow rate of the reactant gas is defined as 0.05 liter/min–0.55 liter/min for the reasons below. If the flow rate is less than 0.05 liter/min, the uniformity of the selective ratio of the substrate surface being etched deteriorates. The flow rate exceeding 0.55 liter/min makes it difficult to discharge the reactant gas within the process chamber by a pump.

According to still another aspect of the invention, an etching method for selectively etching a silicon nitride film formed on a substrate on which a silicon oxide film and the silicon nitride film are formed uses an etching apparatus including a process chamber holding therein the substrate to be etched, gas supply means for supplying a reactant gas into the process chamber, an antenna for supplying into the process chamber a high-frequency wave in the ultra high frequency range, and a coil for generating a magnetic field in the process chamber. The etching is performed under the conditions that the reactant gas includes halogen-based gas, the reactant gas in the process chamber has a pressure of at least 0.5 Pa (3.7 mTorr) and at most 66.7 Pa (500 mTorr), and the reactant gas is supplied into the process chamber at a flow rate of at least 0.05 liter/min (50 sccm) and at most 0.55 liter/min (550 sccm).

The etching apparatus under these conditions can be used to etch the silicon nitride film by plasma produced by the high-frequency wave supplied by the antenna into the process chamber and the magnetic field such that the selective ratio of the silicon nitride film relative to the silicon oxide film is sufficiently high. For the substrate with the silicon oxide film and the silicon nitride film formed thereon, it is possible to prevent the silicon oxide film from being partially removed when the silicon nitride film is selectively etched. In this way, occurrence of any defect such as damage to the substrate can be avoided that is due to removal of the silicon oxide film. It is further possible to avoid defect in the shape of the silicon nitride film from occurring in the etching process, according to the present invention.

The reasons for setting the pressure of the reactant gas at 0.5 Pa-66.7 Pa are as follows. When the pressure is lower than 0.5 Pa, a sufficiently high selective ratio of the silicon nitride film relative to the silicon oxide film is difficult to achieve. On the other hand, when the pressure exceeds 66.7 Pa, the plasma generated in the process chamber is unstable, resulting in instability of etching.

The reasons for setting the flow rate of the reactant gas at 0.05 liter/min-0.55 liter/min are as follows. When the flow rate is lower than 0.05 liter/min, the uniformity of the selective ratio of the substrate surface being etched is impaired. On the other hand, when the flow rate exceeds 0.55 liter/min, the reactant gas in the process chamber is difficult to be discharged by a pump.

Preferably, the etching method according to the one, another, or still another aspect of the invention uses the reactant gas including at least one selected from the group consisting of chlorine gas and hydrogen bromide gas.

Accordingly, the etching rate of the silicon oxide film can be kept low and thus the selective ratio of the silicon nitride film relative to the silicon oxide film can be increased.

Preferably, the etching method according to the one, another, or still another aspect of the invention uses the reactant gas including at least one selected from the group consisting of chlorine gas ($Cl_2$), a mixed gas of chlorine gas and oxygen gas ($Cl_2/O_2$), a mixed gas of chlorine gas and hydrogen bromide gas ($Cl_2/HBr$), a mixed gas of hydrogen bromide gas and oxygen gas ($HBr/O_2$), a mixed gas of chlorine gas, hydrogen bromide gas and oxygen gas ($Cl_2/HBr/O_2$), a mixed gas of hydrogen bromide gas and sulfur hexafluoride gas ($HBr/SF_6$), a mixed gas of chlorine gas and carbon tetrafluoride gas ($Cl_2/CF_4$), a mixed gas of hydrogen bromide gas and carbon tetrafluoride gas ($HBr/CF_4$), and a mixed gas of chlorine gas and sulfur hexafluoride gas ($Cl_2/SF_6$).

Then, the silicon nitride film can be etched maintaining a sufficiently enhanced selective ratio of the silicon nitride film relative to the silicon oxide film.

Preferably, by the etching method according to the one, another or still another aspect of the invention, etching is performed in the process chamber in which provided a member having a surface layer containing aluminum.

In this case, ions and the like as etchants enter the surface layer of the member in the etching process and consequently the etching atmosphere contains aluminum discharged from the surface layer. The inventor has found that the selective ratio of the silicon nitride film relative to the silicon oxide film dramatically improves in such an atmosphere. Then, the silicon nitride film can be etched with a higher selective ratio thereof with respect to the silicon oxide film.

The reason for this is considered as follows. The presence of aluminum in the etching atmosphere allows an aluminum compound (supposedly aluminum-silicon-oxygen compound) to be deposited selectively on the silicon oxide film. This aluminum compound functions as a protective coating for the silicon oxide film. As a result, the selective ratio of the silicon nitride film relative to the silicon oxide film can be improved.

Preferably, by the etching method according to the one, another or still another aspect of the invention, the silicon nitride film is etched by supplying into the process chamber gas containing aluminum.

The etching atmosphere thus contains aluminum. Accordingly, an aluminum compound is selectively deposited on the silicon oxide film and the silicon nitride film can be etched maintaining an enhanced selective ratio of the silicon nitride film relative to the silicon oxide film.

According to a further aspect of the invention, an etching method for selectively etching a silicon nitride film formed on a substrate on which a silicon oxide film and the silicon nitride film are formed uses an etching apparatus including a process chamber holding therein the substrate to be etched and in which plasma for etching is produced. The silicon nitride film is etched in the process chamber provided with a member therein having a surface layer including aluminum.

In the etching process under these conditions, ions and the like as etchants enter the surface layer of the member and consequently the etching atmosphere contains aluminum discharged from the surface layer. An aluminum compound is then deposited selectively on the silicon oxide film so that the silicon nitride film can be etched with a higher selective ratio thereof with respect to the silicon oxide film.

Preferably, according to the etching method according of the further aspect of the invention, the member is grounded.

Accordingly, it is ensured that ions and the like enter the surface layer of the member and aluminum is supplied into the etching atmosphere. The aluminum compound is thus sure to be formed on the silicon oxide film and the silicon nitride film can be etched with the selective ratio thereof relative to the silicon oxide film that is surely improved.

According to a still further aspect of the invention, an etching method for selectively etching a silicon nitride film formed on a substrate on which a silicon oxide film and the silicon nitride film are formed uses an etching apparatus including a process chamber holding therein the substrate to be etched for dry-etching the silicon nitride film. The silicon nitride film is etched by supplying into the process chamber gas containing aluminum.

Accordingly, the etching atmosphere includes aluminum and an aluminum compound is selectively deposited on the silicon oxide film. The silicon nitride film can thus be etched with an increased selective ratio thereof relative to the silicon oxide film.

Preferably, by the etching method according to the one, another, still another or still further aspect of the invention, the gas containing aluminum is organoaluminum-based gas.

When organoaluminum in liquid state is employed, inert gas as carrier gas is blown into the liquid organoaluminum (bubbling), and the bubbled inert gas is supplied to the process chamber. Then, organoaluminum-based gas can relatively easily be supplied to the process chamber for etching.

According to a still further aspect of the invention, an etching apparatus is used to apply thereto the etching method according to one, another, still another, further, or still further aspect of the invention.

This etching apparatus can be used to easily etch the silicon nitride film maintaining an enhanced selective ratio of the silicon nitride film relative to the silicon oxide film.

According to a still further aspect of the invention, a semiconductor device is manufactured by using the etching method according to one, another, still another, further, or still further aspect of the invention.

It is thus possible, in a process of etching a silicon nitride film on a substrate on which a silicon oxide film and the silicon nitride film are formed, to prevent damage to the silicon oxide film. Then, any defect or failure of the semiconductor device due to such damage can be avoided.

According to a still further aspect of the invention, a method of manufacturing a semiconductor device uses the etching method according to one, another, still another, further, or still further aspect of the invention.

In a manufacturing process of the semiconductor device, it is possible to avoid, in an etching step of a silicon nitride film on a substrate on which a silicon oxide film and the silicon nitride film are formed, any damage to the silicon oxide film. Then, any defect or failure of the semiconductor device due to such damage can be avoided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
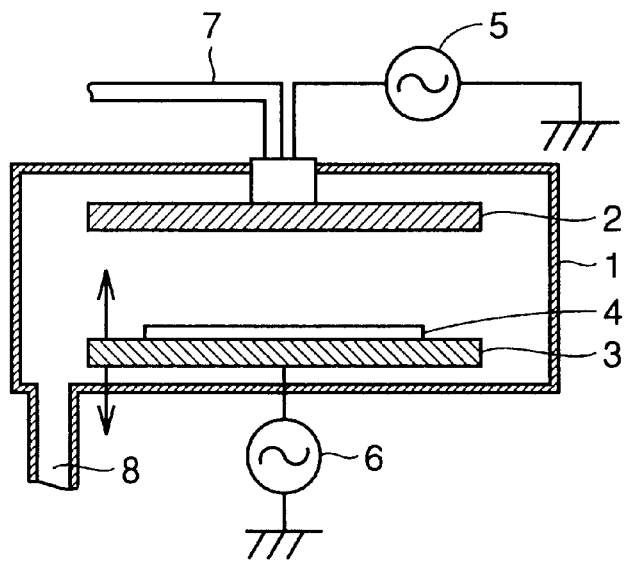
FIG. 1 is a cross section showing an etching apparatus employed in a first embodiment of an etching method according to the present invention.

Embodiments of the present invention are hereinafter described in conjunction with the drawings. It is noted that like or corresponding components are denoted by the same reference character and description thereof is not repeated.

First Embodiment

An etching apparatus is now described in conjunction with FIG. 1 to which a first embodiment of an etching method is applied according to the present invention.

Referring to FIG. 1, the etching apparatus is so-called a two-high-frequency and parallel plate reactive ion etching apparatus, including a chamber 1 as a process chamber, and an upper electrode 2 and a lower electrode 3 arranged to face in parallel within chamber 1. A first high-frequency supply 5 is connected to upper electrode 2, while a second high-frequency supply 6 is connected to lower electrode 3. To chamber 1, a gas inlet tube 7 is connected as means for supplying into chamber 1 a reactant gas for etching. An exhaust outlet 8 is provided to chamber 1 for discharging gas within chamber 1. Exhaust outlet 8 is connected to an exhaust pump (not shown).

A substrate 4 to be etched is placed on lower electrode 3. Lower electrode 3 is movable upward and downward as indicated by the arrows in FIG. 1. The distance between upper electrode 2 and lower electrode 3 (electrode interval) can thus be changed arbitrarily.

Figure 2:
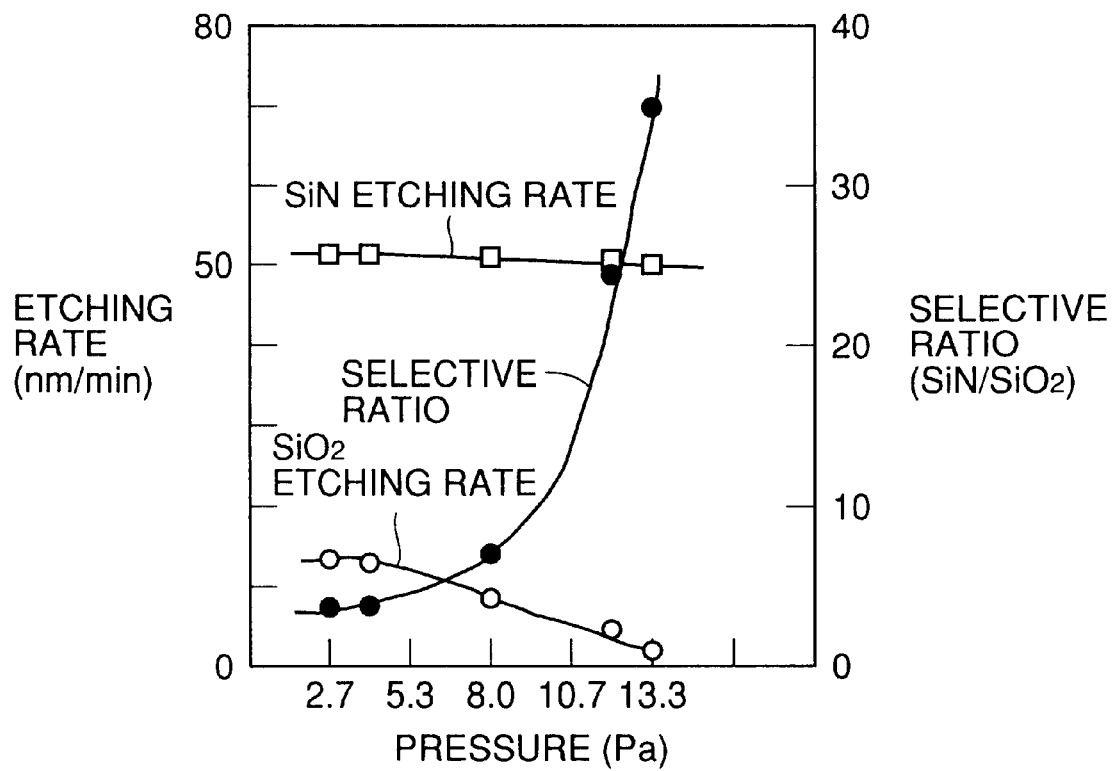
FIG. 2 is a graph showing a relation between the pressure of a reactant gas, the etching rate, and the selective ratio of a silicon nitride film relative to a silicon oxide film in etching of the silicon nitride film performed in the etching apparatus of the invention shown in FIG. 1.

Using the etching apparatus shown in FIG. 1 in which a silicon nitride film and a silicon oxide film were formed on the substrate, the silicon nitride film was etched and a relation was examined between the pressure of a reactant gas, the etching rate, and the selective ratio of the silicon nitride film relative to the silicon oxide film, the resultant relation shown in FIG. 2.

The data shown in FIG. 2 was obtained under the conditions that the frequency and power of a high-frequency current applied to upper electrode 2 were 13.56 MHz and 500 W respectively, the frequency and power of a high-frequency current applied to lower electrode 3 were 13.56 MHz and 90 W respectively, the distance between upper and lower electrodes 2 and 3 (electrode interval) was 80 mm, and chlorine gas ($Cl_2$ 100%) was used as a reactant gas. The indication of pressures on the horizontal axis, 2.7 Pa, 5.3 Pa, 8.0 Pa, 10.7 Pa and 13.3 Pa correspond respectively to 20 mTorr, 40 mTorr, 60 mTorr, 80 mTorr and 100 mTorr.

As understood from FIG. 2, in the range of the pressure of the reactant gas that is at least 6.7 Pa (50 mTorr), the selective ratio of the silicon nitride film with respect to the silicon oxide film sharply increases. At the pressures of 12.0 Pa (90 mTorr) and 13.3 Pa (100 mTorr) respectively, it is possible to achieve sufficiently high selective ratios, approximately 20 and 30 respectively, of the silicon nitride film relative to the silicon oxide film.

In other words, as clearly shown in FIG. 2, it is difficult in the etching apparatus in FIG. 1 to have a sufficiently high selective ratio of the silicon nitride film relative to the silicon oxide film when the pressure of the reactant gas is less than 12.0 Pa. On the other hand, the pressure exceeding 66.7 Pa causes unstable discharging occurring by application of the high-frequency currents to upper and lower electrodes 2 and 3 in chamber 1. As a result, the etching becomes unstable and thus the uniformity of the selective ratio deteriorates. Therefore, the pressure of the reactant gas is preferably equal to or higher than 12.0 Pa and equal to or lower than 66.7 Pa.

Figure 3:
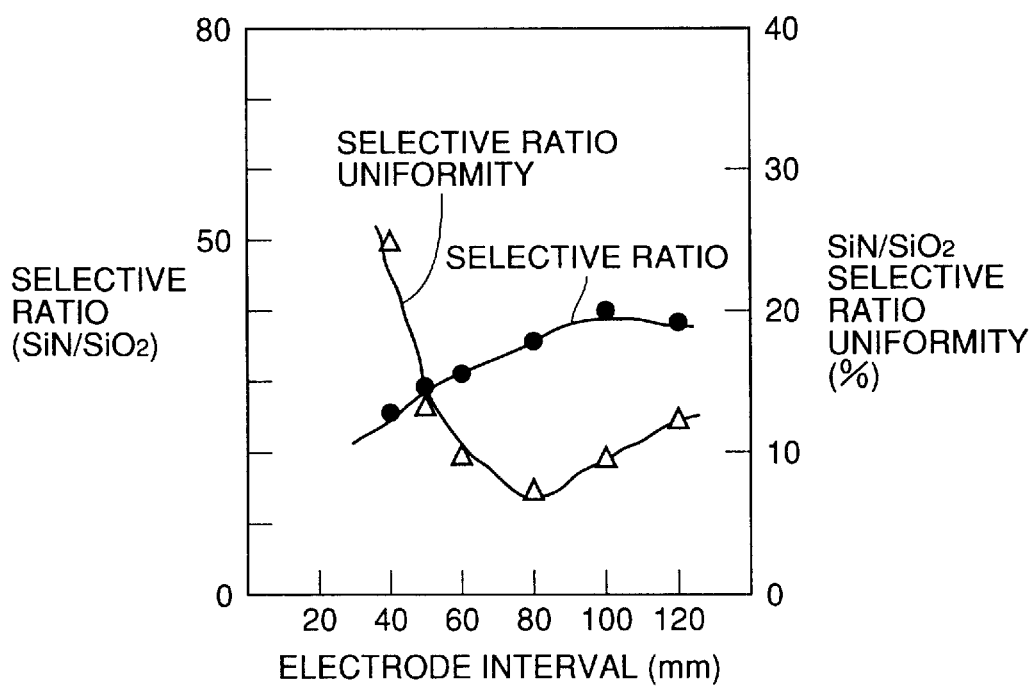
FIG. 3 is a graph showing a relation between the selective ratio of a silicon nitride film relative to a silicon oxide film, the uniformity of the selective ratio of the silicon nitride film relative to the silicon oxide film, and the electrode interval, in the etching apparatus of the invention shown in FIG. 1.

A relation between the selective ratio of the silicon nitride film relative to the silicon oxide film, the uniformity of the selective ratio, and the electrode interval was examined, the resultant relation shown in FIG. 3.

The data shown in FIG. 3 was obtained under the conditions that the frequency and power of a high-frequency current applied to upper electrode 2 were 13.56 MHz and 500 W respectively, the frequency and power of a high-frequency current applied to lower electrode 3 were 13.56 MHz and 90 W respectively, and chlorine gas ($Cl_2$ 100%) was used as a reactant gas having a pressure of 13.3 Pa (100 mTorr).

The uniformity of the selective ratio here represents to what extent the selective ratio varies in the substrate surface being etched. The uniformity was specifically determined by the following method. At nine points in the substrate, the selective ratios of the silicon nitride film relative to the silicon oxide film were measured respectively, and accordingly the maximum and minimum selective ratios (maximum value and minimum value) in the nine selective ratios are determined. A calculation formula, i.e., selective ratio uniformity=((maximum value−minimum value)/(maximum value+minimum value))×100 (%), was used to determine the uniformity of the selective ratio. A smaller value of the selective ratio uniformity indicates a smaller variation of the selective ratio in the etched substrate (superior uniformity).

Referring to FIG. 3, in the range of the electrode interval from 20 mm to 100 mm, the selective ratio monotonously increases as the electrode interval increases. On the other hand, the selective ratio uniformity has the minimum value of approximately 8% when the electrode interval is about 80 mm. Specifically the selective ratio uniformity can be maintained at a preferable value by setting the distance between upper and lower electrodes 2 and 3 (electrode interval) from at least 50 mm to at most 120 mm. In addition, when the distance between upper and lower electrodes 2 and 3 is at least 60 mm and at most 100 mm, the enhancement of the selective ratio uniformity is further ensured.

It is noted that the pressure lower than 13.3 Pa (100 mTorr) in FIG. 3 is likely to result in decrease of the selective ratio of the silicon nitride film relative to the silicon oxide film and a lower value of the selective ratio uniformity (improvement of uniformity).

Figure 4:
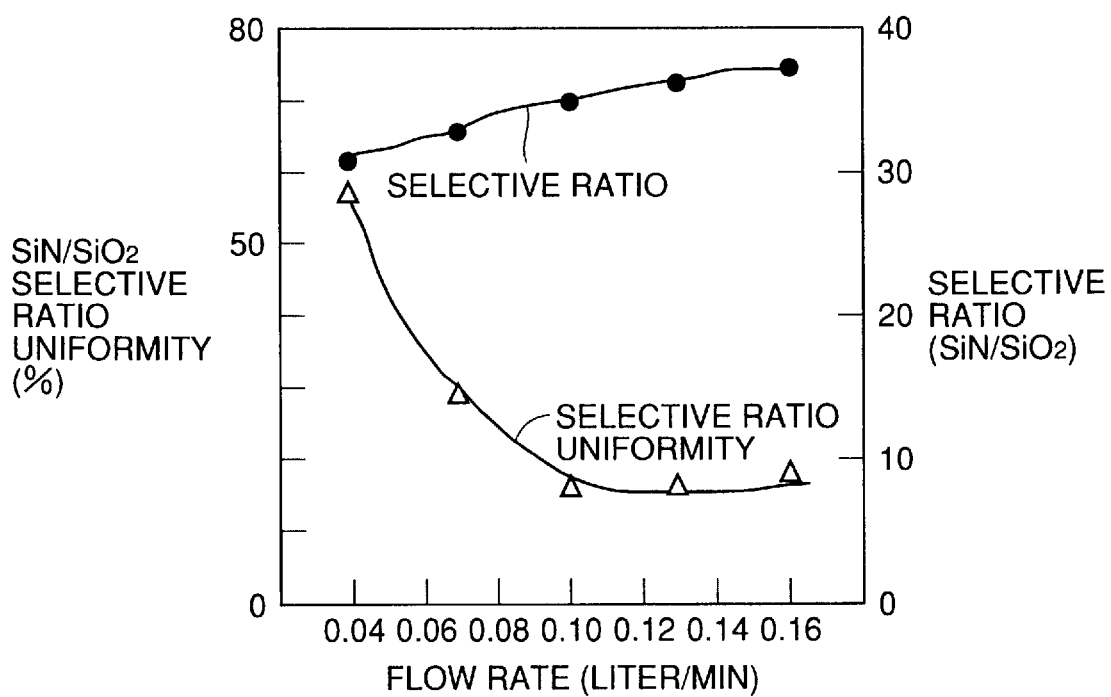
FIG. 4 is a graph showing a relation between the selective ratio of a silicon nitride film relative to a silicon oxide film, the uniformity of the selective ratio of the silicon nitride film relative to the silicon oxide film, and the flow rate of a reactant gas, in the etching apparatus of the invention shown in FIG. 1.

Referring to FIG. 4, the data shown therein was obtained under the conditions that the frequency and power of a high-frequency current applied to upper electrode 2 were 13.56 MHz and 500 W respectively, the frequency and power of a high-frequency current applied to lower electrode 3 were 13.56 MHz and 90 W respectively, the electrode interval was 80 mm, and chlorine gas ($Cl_2$ 100%) at a pressure of 13.3 Pa (100 mTorr) was used as a reactant gas. The indication of flow rates on the horizontal axis, 0.04 liter/min, 0.06 liter/min, 0.08 liter/min, 0.10 liter/min, 0.12 liter/min, 0.14 liter/min and 0.16 liter/min correspond respectively to 40 sccm, 60 sccm, 80 sccm, 100 sccm, 120 sccm, 140 sccm and 160 sccm.

As shown in FIG. 4, with the increase of the flow rate of the chlorine gas as a reactant gas, the selective ratio monotonously increases. On the other hand, the uniformity of the selective ratio sharply increases when the flow rate of the reactant gas is lower than 0.1 liter/min (100 sccm), which means that the uniformity deteriorates. The reason is considered that the pressure adjustment of the reactant gas becomes difficult as the flow rate of the reactant gas decreases. Then, the selective ratio uniformity can be maintained at a satisfactory value by setting the flow rate of the reactant gas at 0.1 liter/min or higher. On the other hand, the flow rate of the reactant gas higher than 0.55 liter/min would make it difficult to discharge gas in chamber 1, resulting in difficulty in achieving a stable etching. Accordingly, the flow rate of the reactant gas is preferably at least 0.1 liter/min (100 sccm) and at most 0.55 liter/min (550 sccm).

The frequency of the high-frequency current supplied to upper electrode 2 is preferably at least 12 MHz and at most 60 MHz, and that supplied to lower electrode 3 is preferably 13.56 MHz. High-frequency supplies 5 and 6 generating high-frequency currents in such frequency ranges are relatively easily available, and thus the manufacturing cost of the etching apparatus according to the invention can be prevented from rising.

The frequency of the high-frequency current applied to upper electrode 2 may be 13.56 MHz. In this case, preferably respective phases of the high-frequency currents supplied respectively to upper and lower electrodes 2 and 3 are different from each other. Then, power supplies of the same standard are applicable to high-frequency supplies 5 and 6.

For the etching apparatus shown in FIG. 1, the flow rate and pressure of the reactant gas and the electrode interval can be set as detailed above to improve the selective ratio of the silicon nitride film with respect to the silicon oxide film and improve the uniformity of the selective ratio. Further, etching can be performed under the conditions described above to prevent defects in the shape of the silicon nitride film occurring in the etching step.

Referring to FIGS. 5–8, a method is described of manufacturing a semiconductor device employing the etching method according to the invention.

Figure 5:
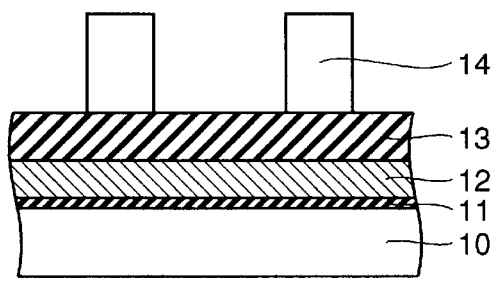
FIGS. 5–8 are cross sections illustrating first to fourth steps of a method of manufacturing a semiconductor device to which the etching method of the invention is applied.

As shown in FIG. 5, a silicon oxide film 11 is formed on a substrate 10, a silicon substrate for example, to form a gate insulating film. Silicon oxide film 11 is 3 nm in thickness. A two-layer film 12 consisting of a tungsten silicide film and a polysilicon film is deposited on silicon oxide film 11 to form gate electrodes. The tungsten silicide film and the polysilicon film are each 50 nm in thickness. A silicon nitride film 13 is formed on two-layer film 12 to a thickness of 150 nm. A resist film (not shown) is formed on silicon nitride film 13, and the resist film is photolithographically processed to generate a resist film 14 having a gate pattern.

Figure 6:
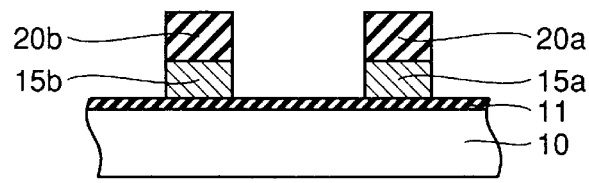

Resist film 14 is used as a mask to partially remove, through etching, silicon nitride film 13 thereby produce upper silicon nitride films 20a and 20b. Resist film 14 is thereafter removed. Upper silicon nitride films 20a and 20b are used as masks to partially remove, through etching, two-layer film 12 thereby produce gate electrodes 15a and 15b. The structure as shown in FIG. 6 is thus achieved.

Figure 7:
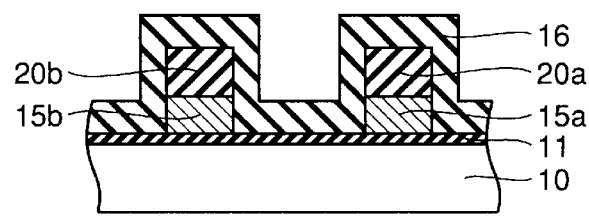

Referring to FIG. 7, a silicon nitride film 16 is formed to cover gate electrodes 15a and 15b. The thickness of silicon nitride film 16 is 40 nm.

Silicon nitride film 16 is partially removed through anisotropic etching to form sidewall films 17a–17d formed of the silicon nitride film on the sidewalls of gate electrodes 15a and 15b.

In the anisotropic etching for generating sidewall films 17a–17d, the etching apparatus shown in FIG. 1 is used and the following conditions are applied. Specifically, chlorine gas is used as a reactant gas, the pressure in the process chamber is at least 12.0 Pa (90 mTorr) and at most 26.7 Pa (200 mTorr), and the flow rate of the reactant gas is at least 0.1 liter/min (100 sccm) and at most 0.35 liter/min (350 sccm). The frequency and power of a high-frequency current applied to the upper electrode are respectively 13.56 MHz and 300 W-600 W, and the frequency and power of a high-frequency current applied to the lower electrode are respectively 15.56 MHz and 80 W-100 W. The distance between upper and lower electrodes (electrode interval) is at least 50 mm and at most 120 mm.

Figure 8:
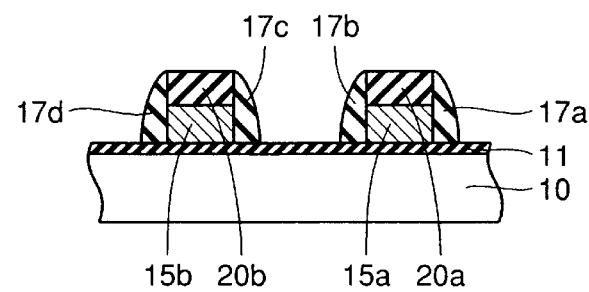

The conditions above can be employed to achieve a sufficiently high selective ratio of the silicon nitride film with respect to the silicon oxide film. Consequently, silicon oxide film 11 is never damaged as shown in FIG. 8, and accordingly substrate 10 is never damaged due to the etching. In addition, the etching method according to the invention never causes any abnormal shape in sidewall films 17a–17d made of the silicon nitride film. In this way, it is possible to prevent any defect from occurring in the semiconductor device, the defect being caused due to any abnormal shape of sidewall films 17a–17d or any damage to substrate 10.

After the step shown in FIG. 8, in areas of a main surface of substrate 10 that are adjacent to gate electrodes 15a and 15b, conductive regions where impurities diffuse are formed to provide source and drain regions, and accordingly a field effect transistor is produced.

Second Embodiment

Figure 9:
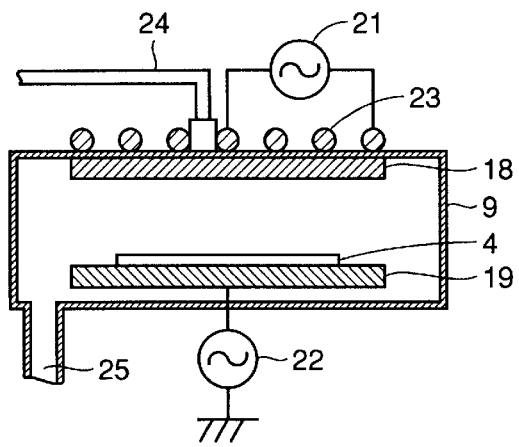
FIG. 9 is a cross section of an etching apparatus employed in a second embodiment of the etching method according to the invention.

An etching apparatus is described in conjunction with FIG. 9 to which a second embodiment of the etching method is applied according to the invention.

Referring to FIG. 9, the etching apparatus is a so-called inductively coupled plasma (ICP) etching apparatus, including a chamber 9 as a process chamber, and an upper electrode 18 and a lower electrode 19 arranged to face in parallel within chamber 9. A coil 23 is provided above upper electrode 18. A first high-frequency supply 21 is connected to coil 23. A second high-frequency supply 22 is connected to lower electrode 19. A gas inlet tube 24 is connected to chamber 9 as means for supplying a reactant gas for etching into chamber 9. An exhaust outlet 25 is provided to chamber 9 for discharging gas in chamber 9. Exhaust outlet 25 is connected to an exhaust pump (not shown). A substrate 4 to be etched is placed on lower electrode 19.

A halogen-based gas is used as a reactant gas for etching a silicon nitride film by the etching apparatus shown in FIG. 9. The distance between substrate 4 and coil 23 is preferably at least 80 mm and at most 1000 mm. More preferably, the minimum distance between substrate 4 and coil 23 is at least 80 mm and at most 200 and the maximum distance therebetween is at least 100 mm and at most 500 mm. The pressure of the reactant gas in chamber 9 is preferably at least 0.5 Pa and at most 66.7 Pa. More preferably, the pressure of the reactant gas in chamber 9 is at least 2.7 Pa (20 mTorr) and at most 66.7 Pa (500 mTorr). The flow rate of the reactant gas supplied into chamber 9 is preferably at least 0.05 liter/min and at most 0.55 liter/min. More preferably, the flow rate of the reactant gas supplied into chamber 9 is at least 0.1 liter/min (100 sccm) and at most 0.55 liter/min (550 sccm).

The etching conditions detailed above can be employed to etch the silicon nitride film with a sufficiently high selective ratio of the silicon nitride film relative to the silicon oxide film as accomplished by the etching method in the first embodiment. Similar effects to those achieved by the etching method of the first embodiment are thus obtained.

This etching apparatus supplies the reactant gas from gas inlet tube 24 into chamber 9 while applies the high-frequency current to coil 23 so as to generate a high-frequency inducted magnetic field within chamber 9. The resultant inducted electric field accelerates electrons in chamber 9. Plasma is thus generated in chamber 9. Accordingly, the plasma density can be changed by the flow rate and pressure of the reactant gas and the value of the high-frequency current applied to the coil 23. On the other hand, a high-frequency bias can be applied to the substrate by application of the high-frequency current from high-frequency supply 22 to lower electrode 19. In this way, the etching apparatus shown in FIG. 9 can control the plasma density and the high-frequency bias separately.

If a great power of the high-frequency current is applied to coil 23 of the etching apparatus in FIG. 9, i.e., the generated plasma has a high density, the selective ratio of the silicon nitride film with respect to the silicon oxide film is likely to improve. A reduced power of the high-frequency current applied to lower electrode 19 (i.e. reduced bias) also improves the selective ratio of the silicon nitride film relative to the silicon oxide film.

Preferably, the following conditions are used to etch silicon nitride film 16 shown in FIGS. 7–8 by the etching apparatus in FIG. 9. Specifically, the applied etching conditions are that the frequency of the high-frequency current applied to coil 23 and lower electrode 19 is 13.56 MHz, the power of the high-frequency current applied to coil 23 is 500 W, and the power of the high-frequency current applied to lower electrode 19 is 90 W. As a reactant gas, chlorine gas ($Cl_2$) or a mixed gas of hydrogen bromide gas and sulfur hexafluoride gas ($HBr/SF_6$) is used. Preferably, the flow rate of the reactant gas is at least 0.1 liter/min (100 sccm) and at most 0.3 liter/min (300 sccm) and its pressure is at least 4.0 Pa (30 mTorr) and at most 26.7 Pa (200 mTorr). In the actual experiment, the minimum distance between coil 23 and the lower electrode was 80 mm, chlorine gas was used as a reactant gas, and the flow rate and pressure of the reactant gas were respectively 0.1 liter/min (100 sccm) and 13.3 Pa (100 mTorr). Under these conditions, the silicon nitride film can be etched with a high selective ratio of the silicon nitride film relative to the silicon oxide film as achieved in the first embodiment.

If the power of the high-frequency current applied to lower electrode 19 is increased, the bias voltage in the direction of the substrate increases and consequently ions and the like as etchants are likely to be accelerated in the substrate direction. In other words, sputtering is stronger than the chemical reaction in the etching process. The difference then becomes narrower in the etching rate between the silicon oxide film and the silicon nitride film and accordingly the selective ratio of the silicon nitride film relative to the silicon oxide film decreases. On the contrary, if the power of the high-frequency current applied to coil 23 is increased, the generated plasma has an increased density. As a result, the density of etchants (chlorine ions and chlorine radical in this case) for etching the silicon nitride film becomes higher and the etching rate of the silicon oxide film is almost the same while the etching rate of the silicon nitride film increases. Accordingly, the selective ratio of the silicon nitride film relative to the silicon oxide film rises. A higher frequency of the high-frequency current applied to coil 23 also increases the plasma density, which would raise the selective ratio of the silicon nitride film relative to the silicon oxide film for the reason as described above.

Third Embodiment

Figure 10:
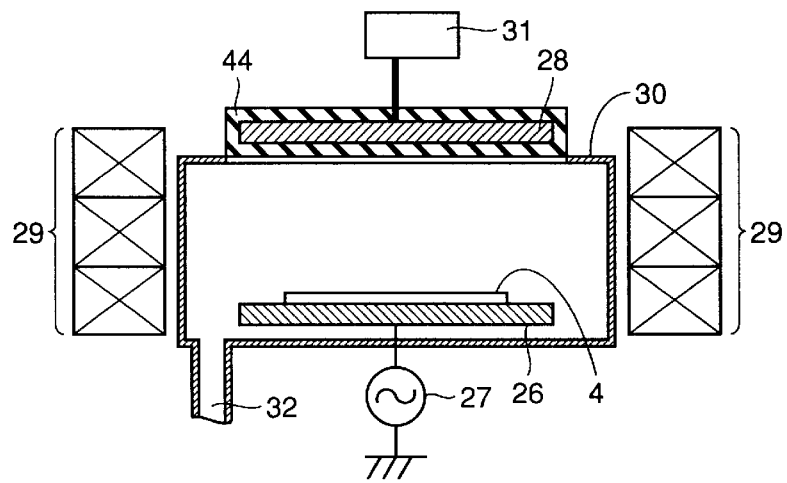
FIG. 10 is a cross section of an etching apparatus employed in a third embodiment of the etching method according to the invention.

An etching apparatus is described in conjunction with FIG. 10 to which a third embodiment of the etching method is applied.

Referring to FIG. 10, the etching apparatus is a so-called parallel plate type ECR (Electron Cyclotron Resonance) etching apparatus including a chamber 30 as a process chamber, an antenna 28 provided at the upper portion of chamber 30 for supplying into chamber 30 a high-frequency wave in the range of UHF (Ultra High Frequency), a dielectric member 44 placed around antenna 28, a lower electrode 26 placed to face antenna 28, a high-frequency supply 31 connected to antenna 28 for applying a high-frequency current in the UHF range, and a coil 29 for generating a magnetic field in chamber 30. A high-frequency supply 27 is connected to lower electrode 26. A substrate 4 to be etched is placed on lower electrode 26. A gas inlet tube (not shown) is connected to chamber 30 for supplying a reactant gas for etching into chamber 30. Further, an exhaust outlet 32 is provided to chamber 30 for discharging gas in chamber 30. Exhaust outlet 32 is connected to an exhaust pump (not shown).

Plasma is produced by electron cyclotron resonance using an electric field caused by the high-frequency wave from antenna 28 and a magnetic field generated by coil 29. The high-frequency wave supplied from antenna 28 into chamber preferably has a frequency of at least 0.3 GHz and at most 1.0 GHz.

The high-frequency wave in the UHF range that is supplied into chamber 30, especially in the range of 0.3 GHz–1.0 GHz, enables the pressure and flow rate of a reactant gas in chamber 30 to be higher than those by a high-frequency wave of approximately 2.45 GHz (microwave) which has been utilized, and accordingly the plasma can be produced in a stable manner.

Such a high-frequency wave in that range can produce a low-density plasma in chamber 30. Then, it is possible to avoid any damage to the substrate due to an increased charge in the substrate or other causes.

Halogen-based gas is used as a reactant gas when a silicon nitride film formed on the substrate is selectively etched, a silicon oxide film and the silicon nitride film being deposited on the substrate, by the etching apparatus shown in FIG. 10, for example, when the etching apparatus is used for etching silicon nitride film 16 shown in FIGS. 7–8. The pressure of the reactant gas in chamber 30 is preferably at least 0.5 Pa and at most 66.7 Pa. More preferably, the pressure of the reactant gas in chamber 30 is at least 2.7 Pa (20 mTorr) and at most 66.7 Pa (500 mTorr). The flow rate at which the reactant gas is supplied into chamber 30 is preferably at least 0.05 liter/min and at most 0.55 liter/min. More preferably, the flow rate at which the reactant gas is supplied into chamber 30 is at least 0.1 liter/min (100 sccm) and at most 0.55 liter/min (550 sccm). Under these conditions, effects similar to those achieved by the first embodiment of the etching method can be obtained.

Fourth Embodiment

Figure 11:
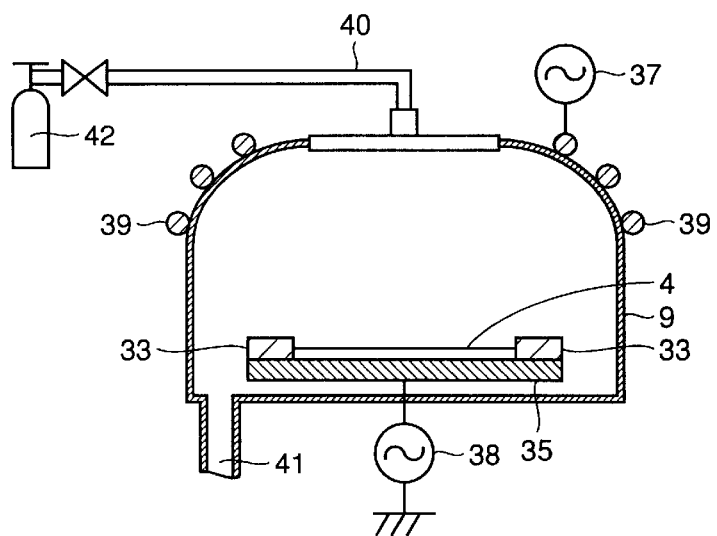
FIG. 11 is a cross section of an etching apparatus employed in a fourth embodiment of the etching method according to the invention.

An etching apparatus is described in conjunction with FIG. 11 to which applied a fourth embodiment of the etching method.

Referring to FIG. 11, the etching apparatus is a so-called an ICP (Inductively Coupled Plasma) etching apparatus in the shape of a dome including a dome-shaped chamber 9 as a process chamber, a lower electrode 35 located in chamber 9, and a coil 39 placed on the upper part of chamber 9. A first high-frequency supply 37 is connected to coil 39. A second high-frequency supply 38 is connected to lower electrode 35. A bomb 42 is connected by a gas inlet tube 40 to chamber 9 for supplying a reactant gas for etching into chamber 9. An exhaust outlet 41 is provided to chamber 9 for discharging gas in chamber 9, that is connected to an exhaust pump (not shown).

A substrate 4 to be etched is provided on lower electrode 35. A focus ring 33 is placed around substrate 4 for improving the etching uniformity. Focus ring 33 has a surface layer formed of aluminum. The etching apparatus applies, similarly to the etching apparatus shown in FIG. 9, a high-frequency current to coil 39 to produce a high-frequency induction magnetic field in chamber 9 so that a resultant induction electric field generates plasma in chamber 9. The etching conditions applied to the apparatus in FIG. 9 can be used to etch a silicon nitride film maintaining a satisfactory high selective ratio thereof relative to a silicon oxide film.

Focus ring 33 has generally been fabricated by using anodized aluminum to constitute the surface layer. The etching apparatus in FIG. 11 uses aluminum instead to form the surface of focus ring 33. The inventor has found that the aluminum dramatically improves the selective ratio of the silicon nitride film relative to the silicon oxide film. Then, the silicon nitride film can be etched with a higher selective ratio thereof with respect to the silicon oxide film. The reason is discussed below for such a remarkable improvement of the selective ratio of the silicon nitride film relative to the silicon oxide film owing to the aluminum forming the surface of focus ring 33. Ions in plasma enter the surface of focus ring 33 and thus aluminum is discharged into an etching atmosphere. A resultant aluminum compound is supposedly deposited selectively on the silicon oxide film.

It is noted that the aluminum compound deposited on the silicon oxide film can easily be removed by cleaning the substrate by a mixed solution of ammonium hydroxide and hydrogen peroxide ($NH_4OH+H_2O_2$).

The inventor conducted the etching process as shown in FIGS. 7 and 8 using a conventional focus ring 33 made of anodized aluminum as a comparative example and focus ring 33 shown in FIG. 11 with its surface made of aluminum under the same conditions except for the focus ring. Specifically, the etching conditions were that the frequency of a high-frequency current applied to coil 39 is 12.75 MHz, the power thereof is 1000 W (or 800–1400 W), the etching gas as a reactant gas was $SF_6$/HBr gas, the flow rate of the reactant gas was 0.1 liter/0.1 liter/min (100 sccm/100 sccm), and the pressure thereof was 3.99 Pa (30 mTorr).

In this way, the selective ratio of the silicon nitride film relative to the silicon oxide film in the etching process and the amount of aluminum present on the silicon oxide film located on the substrate after the etching process were measured. The amount of the existing aluminum was measured by using a secondary ion mass spectrometer (SIMS) as a ratio of existing aluminum to existing silicon on the silicon oxide film on the substrate.

According to resultant measurements for the comparative example, the selective ratio in the etching process was approximately 10–20, and the existence ratio of the aluminum to silicon on the silicon oxide film after the etching process was 0.01 or lower.

For this embodiment, the selective ratio in the etching process was approximately 40–80, and the existence ratio of aluminum to silicon on the silicon oxide film after the etching process was approximately 1–10. The measurements here are extremely higher than those for the comparative example. The reason for this is considered that the aluminum compound (aluminum-silicon-oxygen compound) was produced in the etching process on the silicon oxide film in the case of this embodiment.

The substrate with such an aluminum compound formed thereon was cleaned with a mixed solution of ammonium hydroxide and hydrogen peroxide. After the cleaning, the secondary ion mass spectrometer was used again to measure the existence ratio of aluminum to silicon on the same part of the substrate. The existence ratio thus measured was 0.0001 or lower. This measurement indicates that most of the aluminum compound generated on the silicon oxide film was removed by the cleaning.

The etching method using such a member as focus ring 33 shown in FIG. 11 containing aluminum and provided in the chamber is applicable not only to the dome-shaped inductively coupled plasma (ICP) etching apparatus shown in FIG. 11 but to etching apparatuses of other types. For example, similar effects can be obtained by applying the etching method to a parallel plate ECR etching apparatus as shown in FIG. 12 or the etching apparatuses of the first to the third embodiments.

The element functioning as a source of aluminum into an etching atmosphere may be any except for focus ring 33 that is provided in chamber 9 and has its surface layer formed of aluminum or aluminum alloy.

Figure 12:
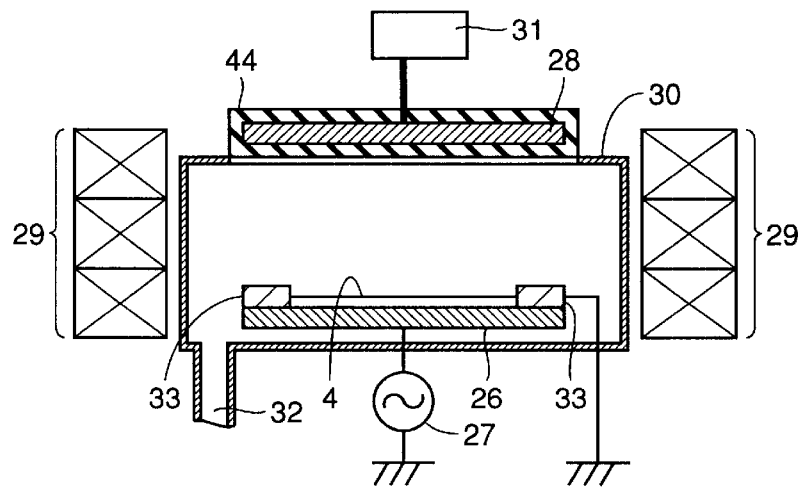
FIG. 12 is a cross section of an etching apparatus employed in a modification of the fourth embodiment of the etching method according to the invention.

Referring to FIG. 12, an etching apparatus, to which a modification of the fourth embodiment of the etching method is applied, is basically similar in the structure to the etching apparatus in FIG. 10. The etching conditions used for FIG. 10 can be applied to etch a silicon nitride film with a high selective ratio thereof relative to a silicon oxide film like that achieved by the etching apparatus shown in FIG. 10.

It is noted that the etching apparatus shown in FIG. 12 includes a focus ring 33 located around a substrate 4 having its surface made of aluminum. The etching apparatus shown in FIG. 12 can be used to perform etching thereby achieve similar effects to those by the etching apparatus in FIG. 11.

Focus ring 33 can be set at a ground potential to ensure that ions and the like in plasma enter the surface layer of focus ring 33 as one member. The aluminum is then surely supplied from focus ring 33 into an etching atmosphere. Accordingly, an aluminum compound is sure to be produced on the silicon oxide film, so that the silicon nitride film can be etched keeping a high selective ratio thereof relative to the silicon oxide film.

Fifth Embodiment

Figure 13:
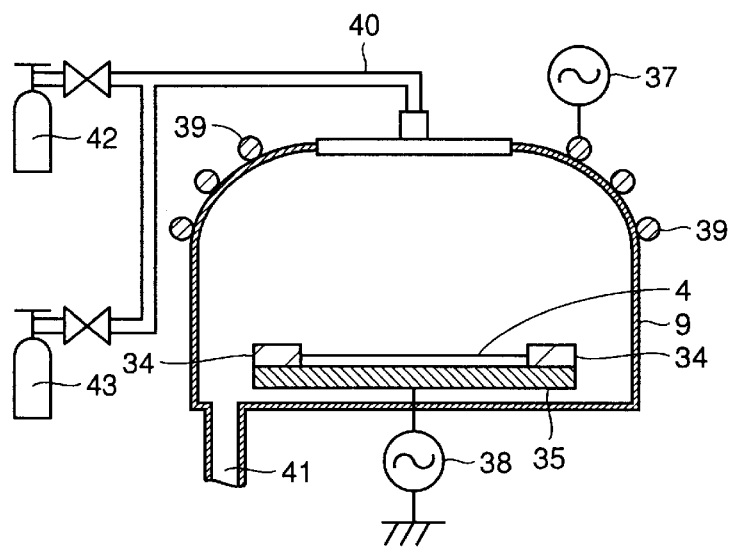
FIG. 13 is a cross section of an etching apparatus employed in a fifth embodiment of the etching method according to the invention.
Figure 14:
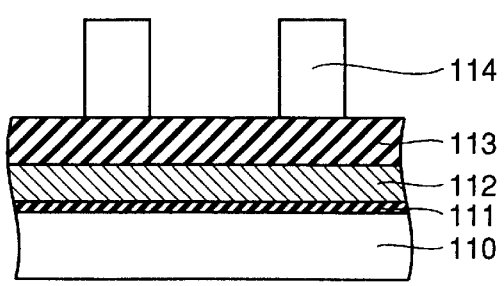
FIGS. 14–17 are cross sections illustrating first to fourth steps of a conventional method of manufacturing a semiconductor device.
Figure 15:
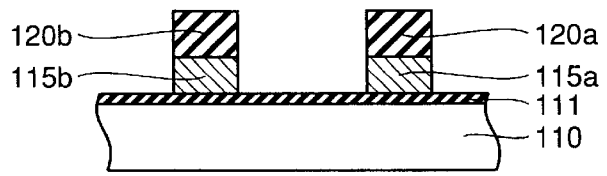
Figure 16:
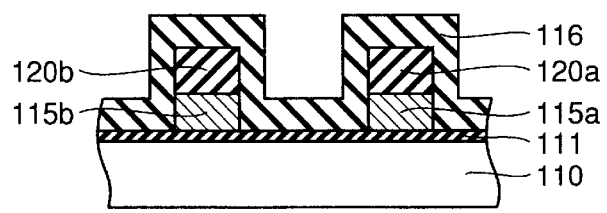
Figure 17:
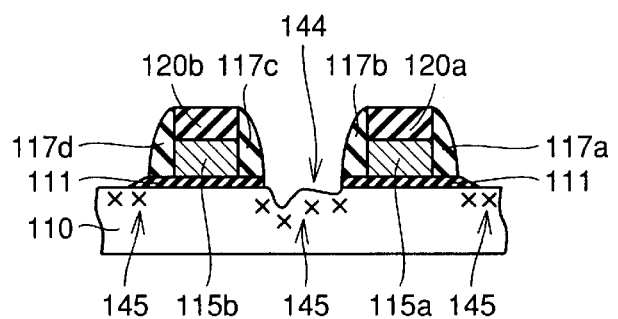
Figure 18:
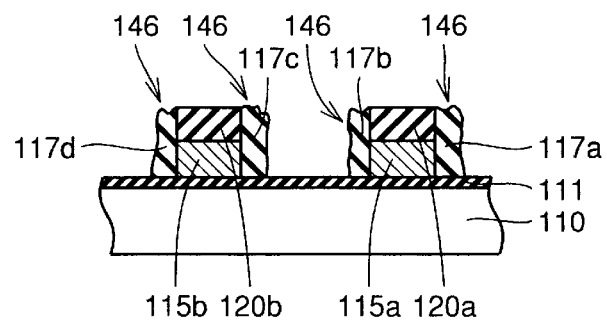
FIG. 18 is a cross section showing abnormality in the shape of sidewall films.

An etching apparatus is described in conjunction with FIG. 13 to which a fifth embodiment of the etching method is applied.

Referring to FIG. 13, the etching apparatus is basically the same in the structure as that shown in FIG. 11. Then, the etching conditions like those for the etching apparatus in FIG. 11 can be applied to etch a silicon nitride film with a high selective ratio thereof relative to a silicon oxide film. It is noted that the etching apparatus shown in FIG. 13 includes a focus ring 34 having its surface layer formed of an anodized aluminum layer as the conventional one. A bomb 43 holding organoaluminum-based gas therein is connected to a gas inlet tube 40. The organoaluminum-based gas containing aluminum is supplied from this bomb 43 through gas inlet tube 40 into a chamber 9. In this way, aluminum can easily be supplied into an etching atmosphere to accomplish similar effects to those of the fourth embodiment of the etching method.

As the organoaluminum-based gas, alkylaluminum gas, for example, $Al_2(CH_3)_6$, $Al(CH_3)_4$ and the like can be used.

The method below can be used to supply liquid organoaluminum compound as a gas into chamber 9. Specifically, a reactant gas or inert gas is discharged into the liquid organoaluminum compound and bubbled, and thereafter the reactant gas or inert gas is supplied into chamber 9. Then, the reactant gas or the like can be used as a carrier gas to supply the organoaluminum compound into chamber 9.

FIG. 13 shows a dome-shaped inductively coupled plasma (ICP) etching apparatus. The fifth embodiment of the etching method is applicable to etching apparatuses of other types, specifically, the parallel plate type reactive ion etching apparatus, parallel plate type ECR etching apparatuses and the like according to the first to the third embodiments, so as to accomplish similar effects.

Preferably, according to the first to the fifth embodiments, the reactant gas for etching includes at least one selected from the group consisting of chlorine gas and hydrogen bromide gas. In addition, the reactant gas preferably includes at least one selected from the group consisting of chlorine gas, a mixed gas of chlorine gas and oxygen gas, a mixed gas of chlorine gas and hydrogen bromide gas, a mixed gas of hydrogen bromide gas and oxygen gas, a mixed gas of chlorine gas, hydrogen bromide gas and oxygen gas, a mixed gas of hydrogen bromide gas and sulfur hexafluoride gas, a mixed gas of chlorine gas and carbon tetrafluoride gas, a mixed gas of hydrogen bromide gas and carbon tetrafluoride gas, and a mixed gas of chlorine gas and sulfur hexafluoride gas. These reactant gases can be used to surely lower the etching rate of the silicon oxide film. As a result, the silicon nitride film can be etched maintaining an enhanced selective ratio of the silicon nitride film relative to the silicon oxide film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An etching method for selectively etching a silicon nitride film formed on a substrate having a silicon oxide film and the silicon nitride film formed thereon, said etching method using an etching apparatus including a process chamber holding therein the substrate to be etched, gas supply means for supplying a reactant gas into said process chamber, an antenna for supplying into said process chamber a high-frequency wave in the ultra high frequency range of 0.3 GHz to 1.0 GHz, and a coil for generating a magnetic field in said process chamber, and the etching performed under the conditions that said reactant gas includes halogen-based gas, said reactant gas in said process chamber has a pressure of at least 0.5 Pa and at most 66.7 Pa, and said reactant gas is supplied into said process chamber at a flow rate of at least 0.05 liter/mm and at most 0.55 liter/mm, wherein the etching is performed by providing in said process chamber a member having a surface layer made of aluminum for supplying the gas in said process chamber with aluminum to increase the etch selectivity of the silicon nitride film with respect to the silicon oxide film.

2. The method according to claim 1, wherein said surface layer made of aluminum is set at a ground potential.

3. An etching method for selectively etching a silicon nitride film formed on a substrate having a silicon oxide film and the silicon nitride film formed thereon, said etching method using an etching apparatus including a process chamber holding therein the substrate to be etched, gas supply means for supplying a reactant gas into said process chamber, an antenna for supplying into said process chamber a high-frequency wave in the ultra high frequency range of 0.3 GHz to 1.0 GHz, and a coil for generating a magnetic field in said process chamber, and the etching performed under the conditions that said reactant gas includes halogen-based gas, said reactant gas in said process chamber has a pressure of at least 0.5 Pa and at most 66.7 Pa, and said reactant gas is supplied into said process chamber at a flow rate of at least 0.05 liter/mm and at most 0.55 liter/min, wherein the silicon nitride film is etched by supplying into said process chamber gas containing aluminum.

* * * * *

UNITED STATES PATENT AND TRADEMARK OFFICE
CERTIFICATE OF CORRECTION

PATENT NO. : 6,686,294 B2
DATED : February 3, 2004
INVENTOR(S) : Kenji Kawai

It is certified that error appears in the above-identified patent and that said Letters Patent is hereby corrected as shown below:

Title page,
Item [73], Assignee, change "Mitsubishi Denki Kabushiki Kaisha" to -- Renesas Technology, Corp. --.

Signed and Sealed this

Twentieth Day of July, 2004

JON W. DUDAS
*Acting Director of the United States Patent and Trademark Office*